US008861302B2

(12) United States Patent
Terzioglu et al.

(10) Patent No.: US 8,861,302 B2
(45) Date of Patent: Oct. 14, 2014

(54) NOR-OR DECODER

(71) Applicant: Mentor Graphics Corporation, Wilsonville, OR (US)

(72) Inventors: Esin Terzioglu, Aliso Viejo, CA (US); Gil I. Winograd, Aliso Viejo, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 13/961,722

(22) Filed: Aug. 7, 2013

(65) Prior Publication Data

US 2013/0321028 A1 Dec. 5, 2013

Related U.S. Application Data

(60) Continuation of application No. 13/295,780, filed on Nov. 14, 2011, which is a continuation of application No. 12/968,261, filed on Dec. 14, 2010, now abandoned, which is a continuation of application No. 12/108,282, filed on Apr. 23, 2008, now Pat. No. 7,852,688, which is a division of application No. 12/031,504, filed on Feb. 14, 2008, now abandoned.

(60) Provisional application No. 60/982,218, filed on Oct. 24, 2007.

(51) Int. Cl.
*G11C 8/10* (2006.01)
*G11C 7/22* (2006.01)
*G11C 8/18* (2006.01)
*G11C 7/18* (2006.01)
*G11C 11/413* (2006.01)

(52) U.S. Cl.
CPC .. *G11C 8/10* (2013.01); *G11C 7/22* (2013.01); *G11C 8/18* (2013.01); *G11C 7/18* (2013.01); *G11C 7/227* (2013.01); *G11C 11/413* (2013.01)
USPC .................................. 365/230.06; 326/108

(58) Field of Classification Search
USPC ....................................... 365/230.06; 326/108
See application file for complete search history.

(56) References Cited

U.S. PATENT DOCUMENTS

| 4,011,549 | A | * | 3/1977 | Bormann | ................... 365/183 |
| 4,048,629 | A | * | 9/1977 | Bormann | ................. 365/230.06 |
| 5,596,539 | A | | 1/1997 | Passow et al. | |
| 5,812,490 | A | | 9/1998 | Tsukude | |
| 6,172,531 | B1 | * | 1/2001 | Aipperspach et al. | ........ 326/108 |
| 6,181,626 | B1 | | 1/2001 | Brown | |
| 6,456,118 | B2 | * | 9/2002 | Beat | ............................. 326/105 |

(Continued)

*Primary Examiner* — Amir Zarabian
*Assistant Examiner* — Jay Radke
(74) *Attorney, Agent, or Firm* — Klarquist Sparkman, LLP

(57) ABSTRACT

A decoder for decoding an address having a plurality of bits ranging from a first address bit $a_1$ to a last address bit $a_N$, each address bit being either true or false is provided that includes a pre-charge circuit adapted to pre-charge a dynamic NOR node and a dynamic OR node and then allow the pre-charged dynamic NOR node and pre-charged dynamic OR node to float; a plurality of switches coupled between the dynamic NOR node and ground, each switch corresponding uniquely to the address bits such that the switches range from a first switch corresponding to $a_1$ to an nth switch corresponding to $a_N$, wherein any switch corresponding to a true address bit is configured to turn on only if its corresponding address bit is false, and wherein any switch corresponding to a false address bit is configured to turn on only if its corresponding address bit is true.

10 Claims, 8 Drawing Sheets

(56) References Cited

U.S. PATENT DOCUMENTS

| | | |
|---|---|---|
| 6,643,204 B1 | 11/2003 | Agrawal |
| 7,738,314 B2 * | 6/2010 | Terzioglu et al. ........ 365/230.06 |
| 7,848,173 B1 * | 12/2010 | Su ........................... 365/230.06 |
| 7,852,688 B2 | 12/2010 | Terzioglu et al. |
| 2002/0191448 A1 | 12/2002 | Ellis et al. |
| 2003/0086304 A1 | 5/2003 | Park |
| 2004/0114424 A1 | 6/2004 | Yoshida |
| 2005/0036400 A1 | 2/2005 | Chen |
| 2006/0176194 A1 * | 8/2006 | Dawson et al. ................. 341/50 |
| 2007/0171750 A1 | 7/2007 | Oh |
| 2008/0043555 A1 | 2/2008 | Hold |
| 2008/0084777 A1 | 4/2008 | Montoye et al. |
| 2008/0123387 A1 | 5/2008 | Imai |
| 2009/0109772 A1 | 4/2009 | Terzioglu et al. |
| 2011/0141840 A1 | 6/2011 | Terzioglu et al. |
| 2012/0235707 A1 | 9/2012 | Terzioglu et al. |

* cited by examiner

NOR-OR DECODER

RELATED APPLICATION

This application is a continuation of U.S. patent application Ser. No. 13/295,780, filed on Nov. 14, 2011, entitled "NOR-OR Decoder," which application in turn was a continuation of U.S. patent application Ser. No. 12/968,261, filed on Dec. 14, 2010, entitled "NOR-OR Decoder," which application in turn was a continuation of U.S. application Ser. No. 12/108,282 filed Feb. 23, 2008 (now U.S. Pat No. 7,852,688, which issued on Dec. 14, 2010), which in turn is a divisional application of U.S. application Ser. No. 12/031,504, filed Feb. 14, 2008, which in turn claims the benefit of U.S. Provisional Application No. 60/982,219, filed Oct. 24, 2007, the contents of all of which are hereby entirely incorporated herein by reference.

TECHNICAL FIELD

The present invention relates to memories and memory devices, and more particularly to an efficient sense command generation scheme that enables faster memory operation.

BACKGROUND

If a user desires an embedded volatile random access memory (RAM), there are generally two choices available: static random access memory (SRAM) and dynamic random access memory (DRAM). DRAM requires just one transistor per storage cell whereas SRAM requires six transistors per memory cell so DRAM demands less die area, thereby being cheaper to manufacture than SRAM. However, the cross-coupled inverters in an SRAM cell help drive the bit lines during a read operation whereas a DRAM memory cell just provides the ephemeral charge stored on its relatively small storage capacitor. Thus, SRAM is much faster than DRAM. So a designer has two choices: cheap and slow (DRAM) vs. fast and expensive (SRAM). For this reason, SRAM tends to be reserved for time-critical implementations such as caches. Given the expense of implementing SRAM, it is desirable to optimize SRAM performance.

One barrier to optimizing performance of SRAMs is that they must respond to an external clock. This limits the SRAM with a variety of restrictions. For instance, suppose an SRAM write operation is triggered by the rising edge of an external clock. In a write operation, the SRAM's X-decoder (word line driver) decodes an address so as to assert the corresponding word line. The asserted word line will be de-asserted after the write operation is completed. This reset of the word line is typically triggered by the subsequent falling edge of the external clock. Thus, the write operation needs to be completed during a half clock cycle (assuming a 50-50 duty cycle) in which the external clock is held high. A read operation is similar in that it too must be completed during a half-cycle of the external clock. Conversely, should the SRAM be triggered by the falling edge of the external clock, it must complete its read or write operations during the time the external clock is held low. For a double-data-rate SRAM, the read/write operations would have to be completed within each half of the external clock cycles. Furthermore, the SRAM is subject to the clock jitter and other timing problems of the external clock as well. Therefore, there is a need in the art for an improved RAM design that is independent of the duty cycle and jitter of an external clock.

RAM performance is also affected by an efficient sense command generation. In general, a RAM must model the delay necessary to develop the word line voltage to drive the gates of access transistor(s) such that the accessed memory cell couples to the bit line. Having modeled this delay, the RAM must then model the bit line voltage development. Having modeled the word line voltage development and the bit line voltage development, the RAM may then assert a sense command such that a sense amplifier coupled to the developed bit line may make a bit decision as to the binary contents of the accessed memory cell. The bit line voltage development must be buffered up to trigger the sense command generation. This buffering involves delay and thus reduces the effective speed of the RAM. Accordingly, there is a need in the art for improved sense command generation schemes.

As discussed above, an SRAM memory cell includes cross-coupled inverters that actively drive the contents of the cell onto the corresponding bit lines. The SRAM sense amplifier detects a resulting bit line voltage development to make a bit decision. As memory densities continue to be enhanced, the capacitance of the SRAM sense amplifier becomes appreciable as compared to the capacitance of the bit lines. The higher the SRAM sense amplifier capacitance, the more power is consumed during read and write operations. Accordingly, there is a need in the art for improved SRAM sense amplifier architecture that provides reduced power consumption.

The x-decoder design is another critical area of RAM performance. The x-decoder decodes address bits so as to assert the appropriate word line and is thus also denoted as a row decoder. The x-decoder typically is triggered to decode a presented address through a rising or falling edge in an externally-provided clock. Once that external clock has triggered a decoding operation, whatever source that is providing the address to the x-decoder is then free to change the address bits so as to prepare for a read or write operation at the next clock cycle. Thus, it is conventional for an x-decoder to latch or register the presented address bits so that they do not change while the external source is changing the address bits for the next clock cycle operation. This latching of address bits consumes power and introduces delay. Accordingly, there is a need in the art for improved x-decoder architectures.

SUMMARY

In accordance with an aspect of the invention, a decoder for decoding an address having a plurality of bits ranging from a first address bit $a_1$ to a last address bit $a_N$, each address bit being either true or false is provided that includes: a pre-charge circuit adapted to pre-charge a dynamic NOR node and a dynamic OR node and then allow the pre-charged dynamic NOR node and pre-charged dynamic OR node to float; a plurality of switches coupled between the dynamic NOR node and round, each switch corresponding uniquely to the address bits such that the switches range from a first switch corresponding to $a_1$ to an nth switch corresponding to $a_N$, wherein each switch is configured to turn on only if its corresponding address bit is false; a (n+1)th switch coupling the dynamic NOR node to the ground; an odd plurality of three or more word line inverters coupled in series with the dynamic OR node, one of the three or more word line inverters being further arranged with cross-coupled inverter; and a word line driven by the odd plurality of inverters.

The invention is not limited to the features and advantages described above. Other features are defined below. The invention is defined by the appended claims.

DETAILED DESCRIPTION

Figure 1:
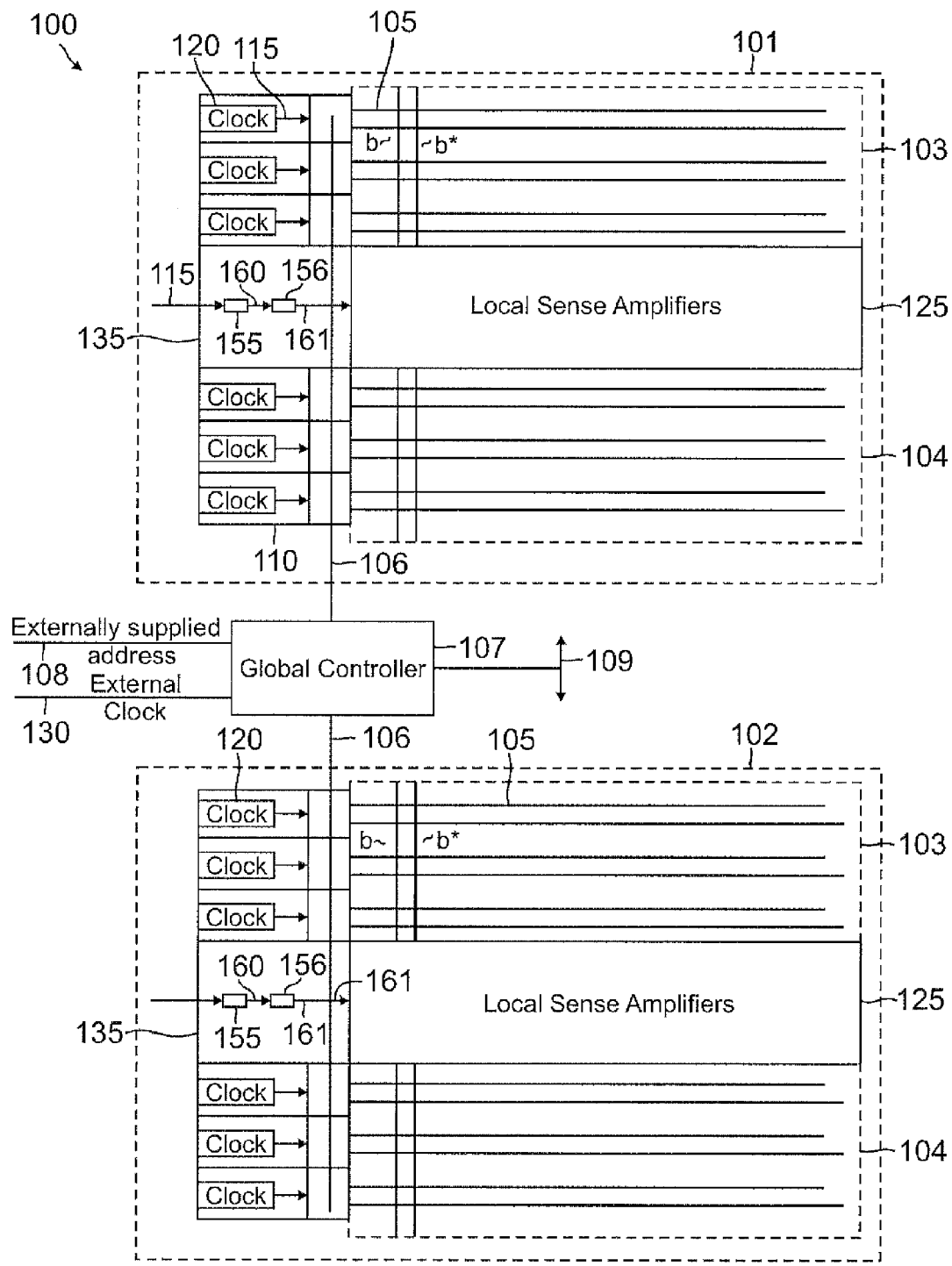
FIG. 1 is a block diagram of an example SRAM having an independent local clock.

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

A RAM is provided that generates a local clock having a clock edge triggered responsive to a clock edge in an external clock. For example, the RAM may include a set/reset latch to generate the local clock. The latch may be set by the assertion of an external clock so as to assert the local clock. As used herein, "assert" shall mean true, regardless of whether a true signal is active high or active low. Assuming the RAM responds to a rising clock edge (active high), the local clock will thus have a triggered (rising) clock edge in response to the setting of the latch. The duty cycle of the local clock is independent from the external clock's duty cycle. Thus, the internal clock edge following the triggered internal clock edge is not responsive to the external clock. Instead, the internal clock edge following the triggered internal clock edge is responsive to a reset signal provided by, for example, a wordline decoder replica circuit.

The wordline decoder replica circuit is triggered by a replica bit line circuit that models the behavior of the RAM's bit lines to determine when the bit lines have developed their appropriate voltages during either a read or write operation. For example, during a read operation, an SRAM sense amplifier determines the voltage difference between the bit line and complement bit lines that couple to an accessed SRAM memory cell. Because an SRAM cell comprises cross-coupled inverters, the bit line is driven high or low (depending upon the binary state of the memory cell) whereas the complement bit line is driven in a complementary fashion. Thus, one line in the bit line pair is pulled low whereas the remaining line is pulled high. Depending upon the sensitivity of the sense amplifier, this voltage difference need not be "full rail" (i.e., the difference between the memory cell power supply voltage and ground) for the sense amplifier to make its bit decision. The replica bit line circuit mimics this voltage difference. In other words, if the sense amplifier merely needs, for example, a 10% development of the full rail difference to make its bit decision, the replica bit line circuit mimics this voltage development. The replica bit line circuit operates analogously during a write operation. A write operation, however, generally requires the sense amplifier to drive the lines in the bit line pair to a full rail voltage difference. The replica bit line circuit mimics this full rail voltage development and signals when the actual bit lines should have had their voltages developed. The bit line replica circuit operation is triggered by the assertion of the local clock.

But a sense amplifier cannot perform a sense operation (as triggered by the assertion of a sense command signal) until the word line is developed as well. Thus, the bit line replica circuit, having replicated the delay necessary for the development of the bit lines, then triggers the word line replica circuit to replicate the additional delay required for the development of the word line. The word line replica circuit, having modeled this necessary word line development delay then asserts a buffered sense command signal. As known in the RAM arts, the sense command signal triggers the sense amplifier to perform its read or write operation. The assertion of the sense command signal triggers a reset of the local RAM clock. In this fashion, the reset of the local RAM clock is asynchronous with the reset of any external clock that may have triggered the assertion of the local RAM clock. It may immediately be appreciated the benefits of such a local clock: whereas a prior art RAM must complete its read or write operations during the time that an external clock is asserted, RAM embodiments disclosed herein free their read or write operation times from the demands of the external clock duty cycle. For example, suppose a RAM requires a millisecond to perform a read or write operation. In the prior art, this RAM could be clocked by an external clock that cycles no faster than 500 cycles per second (assuming a 50% duty cycle) because a clock cycling at 500 cycles per second will be asserted within each one-half clock cycle for 1 millisecond. But by freeing the RAM from the external clock's duty cycle, the present RAM may be cycled at virtually twice the rate (for this example, nearly 1000 cycles per second) because the local clock need not have a 50% duty cycle but instead may have a 70, 80, or even 90% or greater duty cycle. Should the RAM have just a single memory block clocked according to a single local independent clock, the cycling period of the external clock represents an upper barrier to the achievable duty cycle for the local independent clock—i.e, the local independent clock's assertion time cannot exceed 100% of the external clock's period. However, as will be discussed later, a multiplexing of local memory blocks (each having their own independent local clock) would enable each local independent clock to have an assertion time that exceeds 100% of the external clock's period. In this fashion, a RAM having an array of memory blocks each having their own local independent clock may be clocked by an external clock that cycles much faster than would otherwise be possible.

But the local independent clock is just one benefit of the present RAM. Consider how a prior art RAM would generate its sense command—the external clock would trigger the RAM's x-decoder to begin decoding a presented address. Because a RAM must know the appropriate time to trigger its sense signal, it must have a means to determine when both the bit line and the word lines have been properly developed. Note the natural order of such a determination in a write operation—the x-decoder must first develop the word line. As known in the arts, the development of the word line turns on corresponding access transistors such that accessed memory cells may then begin developing the voltages on their bit lines.

Once the bit lines have been properly developed, the sense signal may be asserted. To model this progression, it is customary to include (within the x-decoder) a replica circuit that models the delay necessary to first develop the word line. After modeling this word line delay, the replica circuit replicates the delay necessary to develop the bit lines. After modeling both these delays, the replica circuit asserts the sense command. But note the issue with such a routine sense command generation: the sense signal needs to be buffered so that it may properly drive the sense amplifiers. This buffering takes some time to perform. But the present RAM avoids this delay by using the bit line replica circuit to generate the sense signal through an appropriate driver. The generation of the local clock may be instantiated for each x-decoder circuit such that each x-decoder circuit has its own independent local clock. Alternatively, a local independent clock may be shared for a group of x-decoders as will be explained further herein.

The local independent clock for each x-decoder circuit should not be asserted until the row address to be decoded has settled properly. Because the row addresses are fed to all the x-decoder circuits, these address signals are heavily loaded and may thus have a long transition time before they settle to their proper values. Thus, in certain embodiments, the independent local clock is not simply asserted in response to the assertion of the external clock. Instead, the local clock generation is delayed sufficiently to allow the row address being decoded to properly settle. Assertion of the local clock triggers the x-decoder to begin decoding the row address. As will be explained further herein, an advantageous x-decoder architecture uses positive (non-complemented) and complement versions of the row address for decoding. In one embodiment, the row addresses are processed through a dynamic NOR gate to determine whether a particular word line should be asserted. A NOR gate output is not asserted unless all its inputs are de-asserted. Thus, the selection of whether a given row address bit should be presented to the x-decoder in positive or complement fashion depends upon whether this bit is originally positive or negative. For example, suppose there are just four x-decoders such that they may be addressed by a two-bit address set consisting of [00], [01], [10], and [11]. The NOR gate corresponding to row address [00] needs no inversion of the address bits—it may receive the two address bits in positive form. Similarly, the NOR gate corresponding to row address [01] may receive the first address bit in positive form but receive the second bit in complement form—with just the opposite situation for the NOR gate corresponding to row address [10]. Finally, the NOR gate corresponding to row address [11] receives both address bits in complement form. It may thus be seen that a NOR gate-based x-decoder will receive the complement version of an address bit if the corresponding bit in the x-decoder's address has a binary one value. Similarly, a NOR gate-based x-decoder will receive the positive value of an address bit if the corresponding bit in the x-decoder's address has a value of binary zero (assuming the address bits are active high). Because a word line voltage will be raised in response to a corresponding address decoding, the NOR gate output is inverted to produce a word line assertion signal (thereby representing the logical OR of the NOR gate inputs). It will further explained below that such a dynamic NOR-OR x-decoder circuit combination leads to advantageous results in efficient row redundancy scheme implementations and also in latching the word line assertion. Moreover, this combination of logic and latching in the same circuit block may be advantageously employed in other applications besides that of an x-decoder circuit.

The independent local clock, efficient sense signal generation, and x-decoder architecture discussed above are not the only features of the RAM disclosed herein. These features may be applied to any suitable RAM, for example to either SRAMs or DRAMs. However, additional enhancements may be achieved for certain SRAM embodiments. Thus, the following discussion will be with regard to an example SRAM. However, it will be appreciated that the independent local clock generation, efficient sense command generation, and x-decoder features may be advantageously applied to other types of RAMs such as DRAMs to achieve enhanced DRAM performance.

As will be explained further herein, SRAM sense amplifiers may be modified so that each sense amplifier presents a lower capacitance to the bit lines during a write operation than it would during a read operation. In that regard, a read operation requires a detector, for example, a pair of cross-coupled inverters, to make a bit decision with regard to the voltages on the bit lines being sensed. This read-operation-required detector presents an appreciable amount of capacitance as compared to the capacitance of the bit lines. Thus, power is needlessly discharged through operation of the sense amplifier's detector during a write operation. To address this power loss, each sense amplifier may be modified to present a first capacitance to accessed bit lines during a write operation that is less than a second capacitance presented to the bit lines during a read operation. Additional features of this reduced-power-consumption SRAM sense amplifier will be discussed below.

Turning now to FIG. 1, SRAM 100 includes SRAM memory cells (not illustrated). These memory cells may be arranged in a single array or in multiple arrays such as a first array (which may also be designated as a "block" of memory cells) 101. A second block 102 is also illustrated although it will be appreciated that numerous such blocks may be included within SRAM 100. The memory cells in each block may be separated into a top array 103 and a bottom array 104 so that resources such as local sense amplifiers 125 may be shared between the arrays. As known in the RAM arts, the memory cells in each array may be organized according to word lines 105 driven by X-decoders 110. Each X-decoder 110 (which may also be denoted as a word line decoder) receives a row address during a read or write operation. To enhance density, each x-decoder may drive multiple word lines as will be explained further herein. Alternatively, each x-decoder may drive a single word line. Each x-decoder decodes the row address after the assertion of a local SRAM clock 115 generated by a local SRAM clock source 120. As used herein, the definition of "asserted" depends upon whether a signal is active high or low. If a signal is active high, it shall be deemed as "asserted" if it is in its high state. Similarly, if a signal is active low, it shall be deemed as "asserted" if it is in its low state. Sense amplifiers 125 access memory cells during read and write operations through the corresponding bit and bit complement lines such as example bit line b and example complement bit line b*.

As illustrated, SRAM 100 operates synchronously with an external clock 130. However, it will be appreciated that internal clock source 120 could be responsive to a handshaking signal as used in asynchronous SRAM designs. Accordingly, the internal clock generation discussed herein may be practiced in either synchronous or asynchronous SRAMs. Thus, although the following discussion is directed a synchronous embodiment, it will be understood that the scope of the appended claims is not limited to such synchronous designs.

Local clock source 120 asserts a local clock 115 responsive to a clock edge in external clock 130 that may be received by a global controller 107. Global controller 107 receives an address 108 that selects for a particular word line. For example, suppose SRAM 100 includes 1048 different word lines. To select for any particular word line, address 108 would need to be 11 bits wide. A certain portion of these address bits may code for which block the word line is located. For example, if there are four blocks, two-bits in the address could be decoded by global controller to generate a block signal 109 that selects for a particular block. Another address bit within address 108 may indicate whether it is the top array or the bottom array that is being addressed. To save power, only those clock sources within the selected block portion (top or bottom) are active. Thus, the remaining x-decoders will waste no power needlessly decoding an address that does not pertain to them. The remaining bits in the presented address may be denoted as a local row address 106. In one embodiment, local SRAM clock source 120 may include a set/reset (RS) latch to latch the local clock. It will be appreciated that local clock 115 could be generated by, for example, a local controller 135. However, if each x-decoder associates with its own local clock source, scaling advantages will be achieved because as the number of word lines increases, the driving force of the local clock source 120 need not change. In contrast, a centralized local clock source such as local controller 135 would require bolstering to drive across more and more x-decoders as design density is increased.

In response to the assertion of local SRAM clock 115 within the selected x-decoders, a decoding and latching circuit decodes local row address 106 and latches the decoded result. As will be explained further herein, a particularly advantageous decoding and latching circuit comprises a dynamic NOR-OR-latch combination. X-decoder 110 will then maintain the assertion of the corresponding word line until it is commanded to release this line. In the prior art, this command was typically the de-assertion of the external clock 130. But note that SRAM 100 must then compete its read and write operations within the duty cycle of the external clock—i.e, during the half cycle for which the external clock is asserted.

To free SRAM 100 from external-clock-duty-cycle-imposed restraints, SRAM 100 includes a bit line replica circuit 155 and a driver 156. A convenient location for these circuits is local controller 135. Bit line replica circuit 155 is triggered by local clock 115. Bit line replica circuit 155 determines if a bit line development has been completed and then asserts a completion signal 160 to driver 156. Driver 156 models the delay necessary for x-decoder 110 to develop the necessary word line (corresponding to the decoded address) and asserts a buffered sense command signal 161. Sense signal 161 not only triggers the appropriate sense amplifiers in the array 125 to fire but also resets local clock 115 either directly or indirectly through assertion of a reset signal. Should local clock source 120 comprise an RS latch, such a reset signal triggered by sense command signal 161 couples to the reset terminal. Thus, upon assertion of sense command signal 161, local SRAM clock 115 will be de-asserted. In response, x-decoder 110 will release the assertion of the asserted word line such that SRAM 100 is placed into a default/waiting-for-a-read-or-write-command state. Similarly, during a read operation, the appropriate sense amplifier(s) (corresponding to the bit lines to the memory cell(s) being read) may be triggered by the assertion of sense command signal 161 to perform its bit decision operation—i.e, decide whether the accessed memory cell was storing a binary true or false state. It will be appreciated that the sense amplifiers may be triggered by other signals to perform a bit decision operation but such alternative signals should not be asserted prior to the assertion of sense command signal 161. Note the advantages of such a local SRAM clock generation—SRAM 100 is no longer tied to the duty cycle of external clock 130. For example, if external clock 130 cycles at a rate such that SRAM 100 requires a 75% duty cycle to complete its read or write operations, SRAM 100 will generate local SRAM clock 115 at the appropriate duty cycle independent of the external clock's duty cycle. Moreover, local SRAM clock 115 is divorced from jitter and other noise that may be present in external clock 130.

Figure 2:
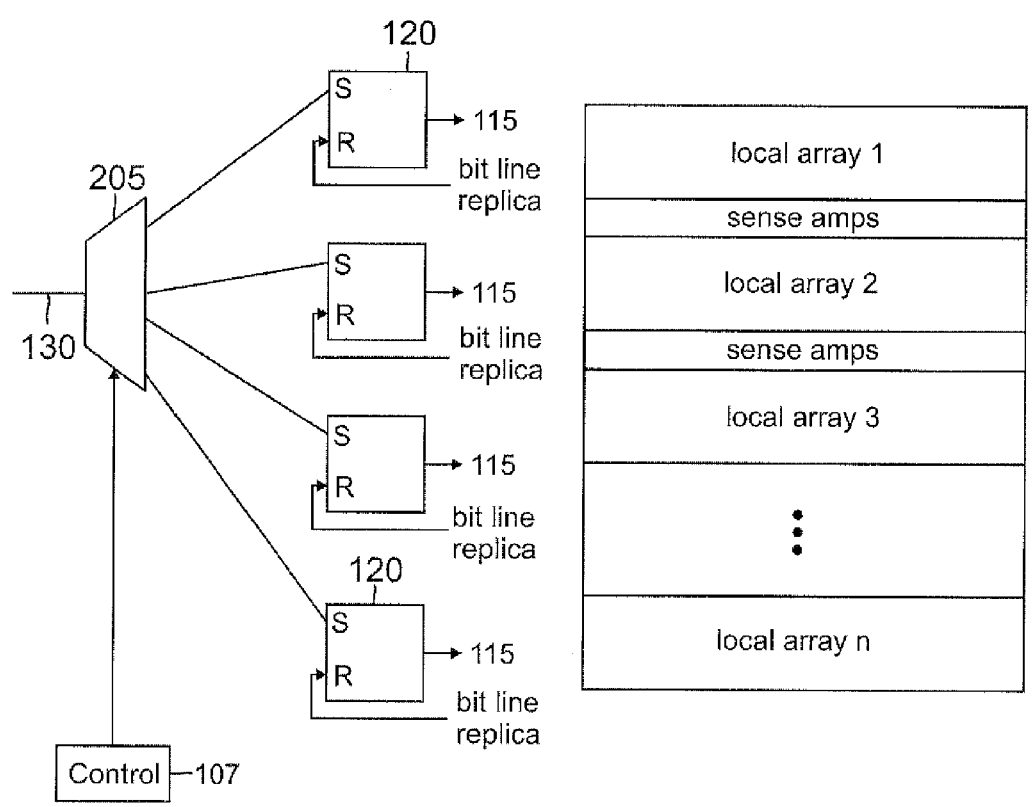
FIG. 2 is a block diagram of an example SRAM having multiple local memory arrays, wherein each local memory array has an independent local clock.

The generation of a local SRAM clock may be generalized across a plurality of local SRAM memory cell arrays as shown in FIG. 2 with regard to blocks 1 through n. Each block associates with its own local SRAM clock source 120. For illustration clarity, only a single source is illustrated for each block. External clock 130 may be cycling at a rate far too fast for any local SRAM array to complete a read or write operation even if a 100% local clock duty cycle were implemented. However, a control circuit such as global controller 107 controls a multiplexing of the read and write operations across the local arrays. For example, suppose external clock 130 cycles at a rate three times faster than the greater of either a read or write operation period within the local arrays. Upon every assertion of external clock 130, global controller 107 may determine which local arrays are available for a read/write operation and select from these available arrays. Given such a selection, global controller 107 controls a demultiplexer 205 receiving external clock 130 to drive the selected array's local SRAM clock source 120 with the de-multiplexed external clock. The selected local SRAM clock source will then assert its local SRAM clock 115 in response to the assertion of the external clock as discussed previously. Each local SRAM clock source is reset by a corresponding bit line replica circuit and x-decoder replica circuit (not illustrated but discussed with regard to FIG. 1). In this fashion, a first local array may be triggered to perform a read/write operation in response to a first assertion of the external clock. While this first local array is still performing the read/write operation, a second local array may be triggered to perform a read/write operation in response to a second assertion of the external clock, and so on. The SRAM may be driven by an external clock (or asynchronous command) that cycles many times faster than would be achievable in a conventional SRAM that is constrained by the external clock's duty cycle.

Figure 3:
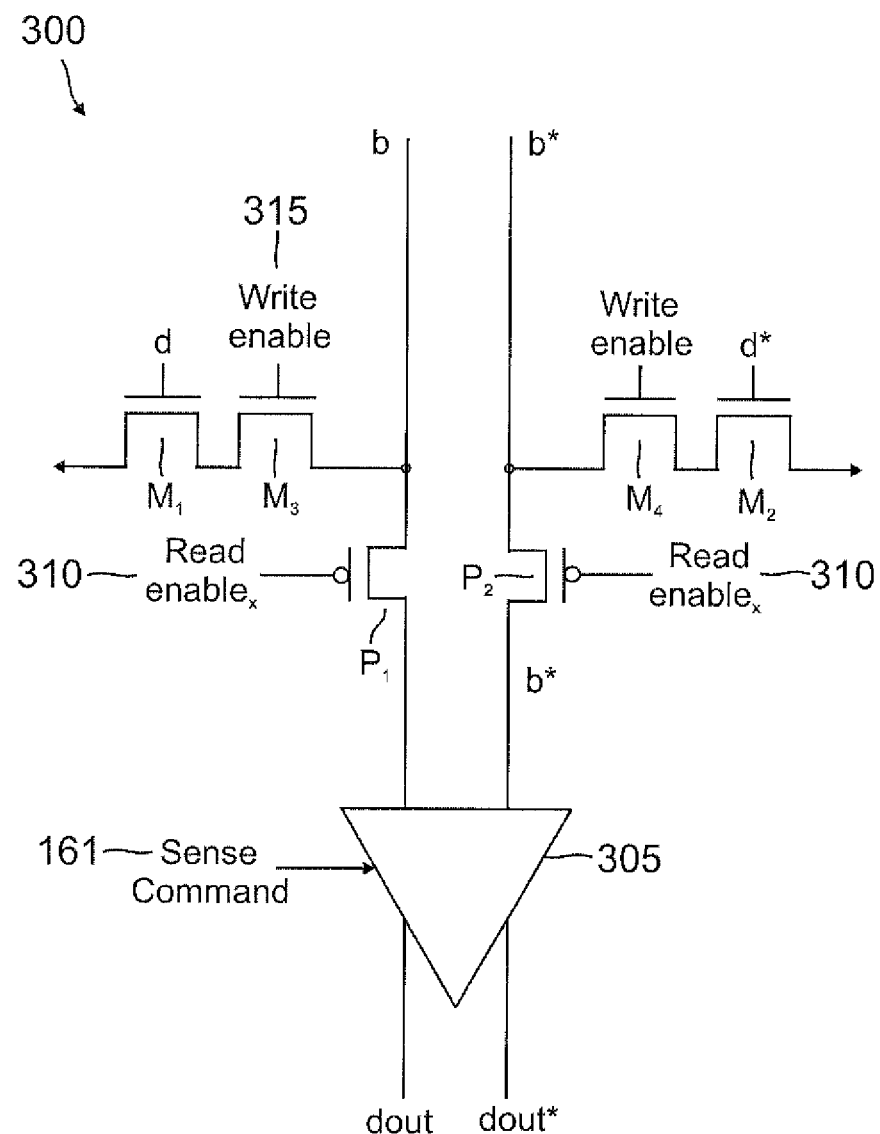
FIG. 3 is an example low-power SRAM sense amplifier.

Turning now to FIG. 3, an example SRAM sense amplifier 300 is illustrated. SRAM sense amplifier 300 advantageously lowers its power consumption because it is configured to present a lower capacitance to the bit lines during a write operation than the capacitance it presents to the bit lines during a read operation. As known in the arts, SRAM sense amplifier 300 includes a signal detector 305 that makes a bit decision during a read operation by sensing the states of bit line b and complement bit line b*. This signal detector is triggered to make its bit decision upon activation or triggering by sense command 161. As illustrated, signal detector 305 drives a data output node $d_{out}$ and a complement data output node $d_{out}*$ with the results of the read bit decision but it will be appreciated that a single-ended output node could be provided. Signal detector 305 couples to the bit lines during a read operation through switches such as PMOS transistors P1 and P2. The gates of these transistors are driven by an active low read enable signal 310 or other suitable driving signal that is not asserted during write operations. Thus, during a write operation, the signal detector is not coupled to the bit lines. Instead, the bit line to be pulled low (depending upon the binary state of a data signal d to be written to the corresponding memory cell) is pulled through switches such as transistors M1 and M2. Transistors M1 and M2 have their gates driven by data signal d and its complement signal d*, respectively. Transistors M1 and M2 couple through to their respective bit lines though transistors M3 and M4 that have their gates driven by an enabling signal such as a write enable signal 315. Thus, if the data signal d to be written is high, bit line b will be grounded. Alternatively, if data signal d* is high, bit line b* will be grounded. In this fashion, a bit is written into the corresponding memory cell by grounding the appropriate bit line through a switch. In one embodiment, global controller 107 of FIG. 1 may generate enable signals 310 and 315. Advantageously, the capacitance of a switch such as the series connected transistors M1 and M3 (or M4 and M2) that will load the corresponding bit line is substantially less than that presented by the signal detector 305 during a read operation. For example, signal detector 305 may comprise cross-coupled inverters analogous to those used in an SRAM memory cell. It may thus be seen that substantial power may be conserved by isolating signal detector 305 from the bit lines during a write operation and instead using a separate switch to ground the appropriate bit line.

Figure 4A:
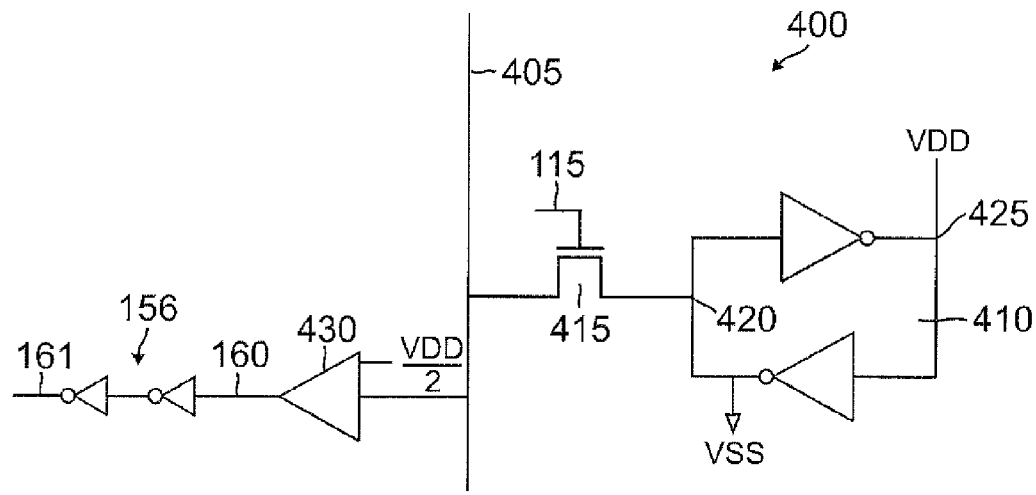
FIG. 4a is circuit diagram of an example read-operation replica bit line circuit.

Replica bit line circuit embodiments will now be discussed. To properly model the bit line behavior, the replica bit lines circuits will need to model the different capacitive loading presented to the bit lines during these operations. Because the period needed to complete a read operation is different from that period needed to complete a write operation, bit line replica circuit 155 discussed with regard to FIG. 1 may comprise a read-operation bit line replica circuit and a write-operation bit line replica circuit. Turning now to FIG. 4a, a read-operation replica bit line replica circuit 400 is illustrated. Replica bit line circuit 400 includes a replica bit line 405 that mirrors the electrical characteristics of the bit lines in the memory array being modeled. Alternatively, bit line 405 may have proportional electrical characteristics that would be accounted for in determining when a read operation has been completed. A replica SRAM memory cell 410 couples to replica bit line 405 through a replica access transistor 415. It is convenient for these components to also have electrical characteristics that minor the corresponding components in the memory array being modeled but proportional characteristics may also be implemented. Replica SRAM cell 410 is biased so that a node 420 is maintained at ground (VSS). Thus, a complementary node 425 is biased by a power supply voltage VDD. To respond to the assertion of the local SRAM clock 115, this clock (or a signal triggered by this clock) may drive the gate of replica access transistor 415. Replica bit line 405 may be pre-charged as it would have been in the corresponding memory array and then tri-stated and allowed to float. Because replica access transistor 415 will conduct in response to the assertion of the local SRAM clock source 115, replica bit line 405 will then be pulled towards VSS. A comparator 430 compares the voltage on replica bit line 305 to a suitable threshold voltage such as, for example, VDD/2. When a threshold is passed, comparator 305 will assert completion signal 160 that will then trigger the driver circuit 156 (of FIG. 1). It will be appreciated that some scaling may be implemented—for example, an actual sense amplifier may only require a 10% development on the bit line whereas comparator 330 is testing for a 50% development. In such a case, the memory cell and/or the bit line may have its electrical characteristics scaled so that the completion signal is asserted after an appropriate amount of delay. Moreover, note how an adaptive embodiment may be implemented: bit line 405 could couple to multiple replica memory cells through additional switches that are operated according to signals burned in during manufacture. In other words, a priori, it may not be known if a memory is fast or slow because of process corner variations and other effects. The default state of the read operation bit line replica circuit could then be to couple to just one replica SRAM cell. Additional replica SRAM cells could then be switched on and the memory tested to see whether the read operation was successful. In this fashion, the read operation bit line replica circuit could be tuned to operate as fast as a successful read operation allows to thereby enhance memory operation speed. After finding the ideal characteristics of the read operation replica bit line circuit, the memory is burned in with signals such that the corresponding number of replica SRAM cells are coupled to the bit line during subsequent operation of the read operation bit line replica circuit.

Figure 4B:
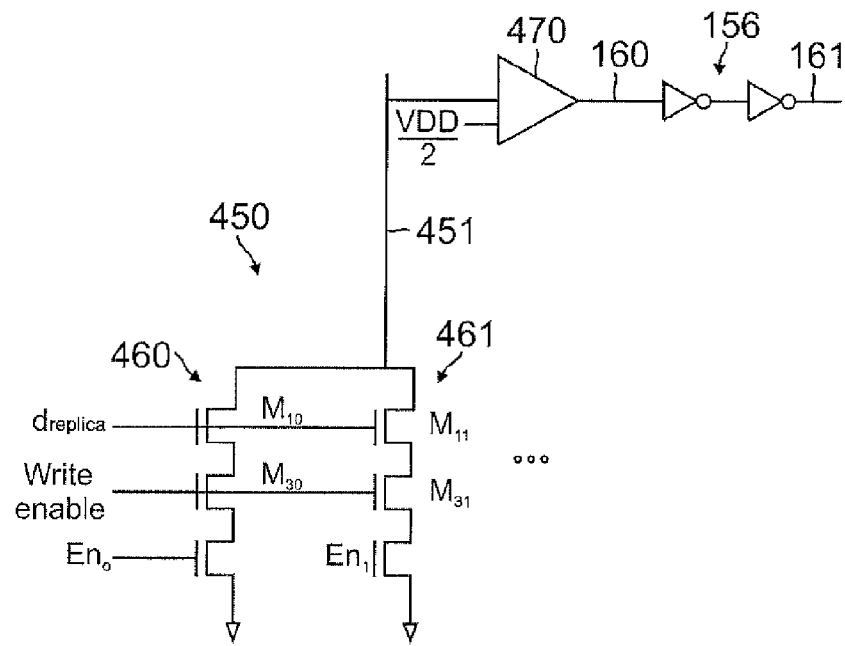
FIG. 4b is a circuit diagram of an example write-operation replica bit line circuit.

Turning now to FIG. 4b, a write operation bit line replica circuit 450 operates analogously. Referring back to FIG. 3, a bit line is pulled to ground through corresponding transistors M1 or M2 depending upon the state of the d and d* signals. Write operation bit line replica circuit 450 models this pulling of a bit line to ground through these switches. However, as discussed with regard to FIG. 4a, write operation bit line replica performance may be tuned according to individual process corner variations. Thus, a replica bit line 451 couples to one or more replica switches such as replica switches 460 and 461. As discussed analogously with regard to FIG. 4a, providing a plurality of replica switches enables a user to customize the operation of write operation bit line replica circuit to maximize write operation speed. For example, first switch 460 couples to ground through a transistor driven by an enabling signal $En_0$. If this enabling signal is burned in at manufacture so as to be asserted during regular operation, switch 460 may couple bit line replica 451 to ground. A comparator 470 or other suitable detector senses the voltage change on the replica bit line analogously as discussed with regard to comparator 430. Switch 460 contains replica transistors M10 and M30 that replicate transistors M1 and M3 of FIG. 3. However, a replica data signal d replica that drives the gate of M10 is always asserted unlike the actual data signals d. Transistor M30 has its gate driven by the write enable signal. Similarly, a second switch 461 includes replica transistors M11 and M31 that couple to ground through a transistor driven by an enabling signal $E_{n1}$, and so on. As discussed with respect to the read operation bit line replica circuit, these multiple replica switches are enabled depending upon the write operation speed determined at manufacture. For example, a default state may be such that only enabling signal $E_{no}$ is enabled. At manufacture, the memory is tested with additional switches enabled in addition to switch 460. In other words, a write operation occurs, for example, using two replica switches. If the bit error rate is still within acceptable limits, it is thus known that the write operation speed may be enhanced as compared to that speed achieved using just one replica switch. Another write operation may be tested using three replica switches, and so on until a threshold is reached where the write operation speed has been increased to a point that unacceptable bit error occur. The memory would then be "burned in" with the appropriate enabling signals such that the maximum number of switches are enabled that still provides a sufficient write operation period such that bit error rates are within acceptable limits. It may be seen that as the number of replica switches that couple to replica bit line 451 is increased, the faster will be the pull of replica bit line 451 to ground such that a corresponding write operation period is decreased. Referring back to FIG. 4a, bit line 405 will also be pulled to ground faster as the number of replica memory cells that couple to bit line 405 through corresponding access transistors is increased. Each access transistor is placed in series with an enabling transistor driven by a corresponding enabling signal analogously to the arrangement shown for write operation bit line replica circuit 450 of FIG. 4b. At manufacture, increasing numbers of replica memory cells are coupled to the replica bit line and read operations performed. Eventually, the read operation period will be too short to allow an accurate read such that a bit error rate becomes unacceptable. A maximum number of replica memory cells that may couple to the replica bit line yet provide acceptable read performance may thus be determined and the corresponding enable signals burned into a non-volatile memory. In this fashion, an adaptive process enables tuning of a memory upon manufacture for optimum read and write operation speeds. For either a read or write operation, the manufacture could test the maximum-achievable bit line replica speeds that enable successful reads or writes. The appropriate enabling signals to the bit line replica circuits are then "burned" into a non-volatile memory such that the resulting memory is thereby permanently tuned for optimal performance.

The assertion of the bit line completion signal 160 from comparators 470 or 430 is then buffered through a driver 156 such as a pair of inverters as shown in FIGS. 4a and 4b. The resulting sense command signal 161 generation may be compared to a conventional sense command generation to better highlight its advantageous properties. In a conventional sense command generation, a circuit such as an x-decoder must model two periods of time. The first period of time corresponds to the delay between a triggering clock edge in external clock 130 and the appropriate word line voltage development such that an accessed memory cell is now coupled to its bit line(s). The second period of time corresponds to the delay between the coupling of the accessed memory cell to its bit line and the resulting bit line voltage development. As discussed previously, it is conventional to have some sort of row address replica circuit replicate the first period of time whereupon a bit line replica circuit is triggered to replicate the second period of time so that a sense command signal may be asserted. But the trouble with such a scheme is that the sense command signal needs buffering so as to have the appropriate drive strength to trigger its sense amplifier. Once an x-decoder is designed, the delay that will occur between a triggering clock edge in external clock 130 and the assertion of the word line is known. For example, an advantageous dynamic NOR/OR x-decoder structure will be discussed further with regard to FIGS. 5a and 5b that asserts a word line. Given such a design, the transistors in driver 156 may be sized similarly to the x-decoder structure such that the same delay occurs between the assertion of bit line completion signal 160 and the assertion of sense command signal 161. In that regard, it will be appreciated that driver 156 need not be separate from comparators 430 and 470 in FIGS. 4a and 4b, respectively. Instead, each comparator may be designed so as to assert sense command signal 161 as an output with the appropriate delay and drive strength. Advantageously, the delay occurred in prior art sense command signal generation schemes with regard to the buffering of a bit line completion signal is avoided. In other words, a prior art scheme involved two buffering stages: a first buffering so that the row address replica circuit may drive its replica word line and a second buffering for an output of the bit line replica circuit. In contrast, there is only one buffering stage with regard to the read operation and write operation bit line replica circuits discussed herein. Accordingly, enhanced memory operation speed is achieved because a sense command signal may be advantageously asserted at approximately the exact time the real bit line voltage has been developed.

Figure 5A:
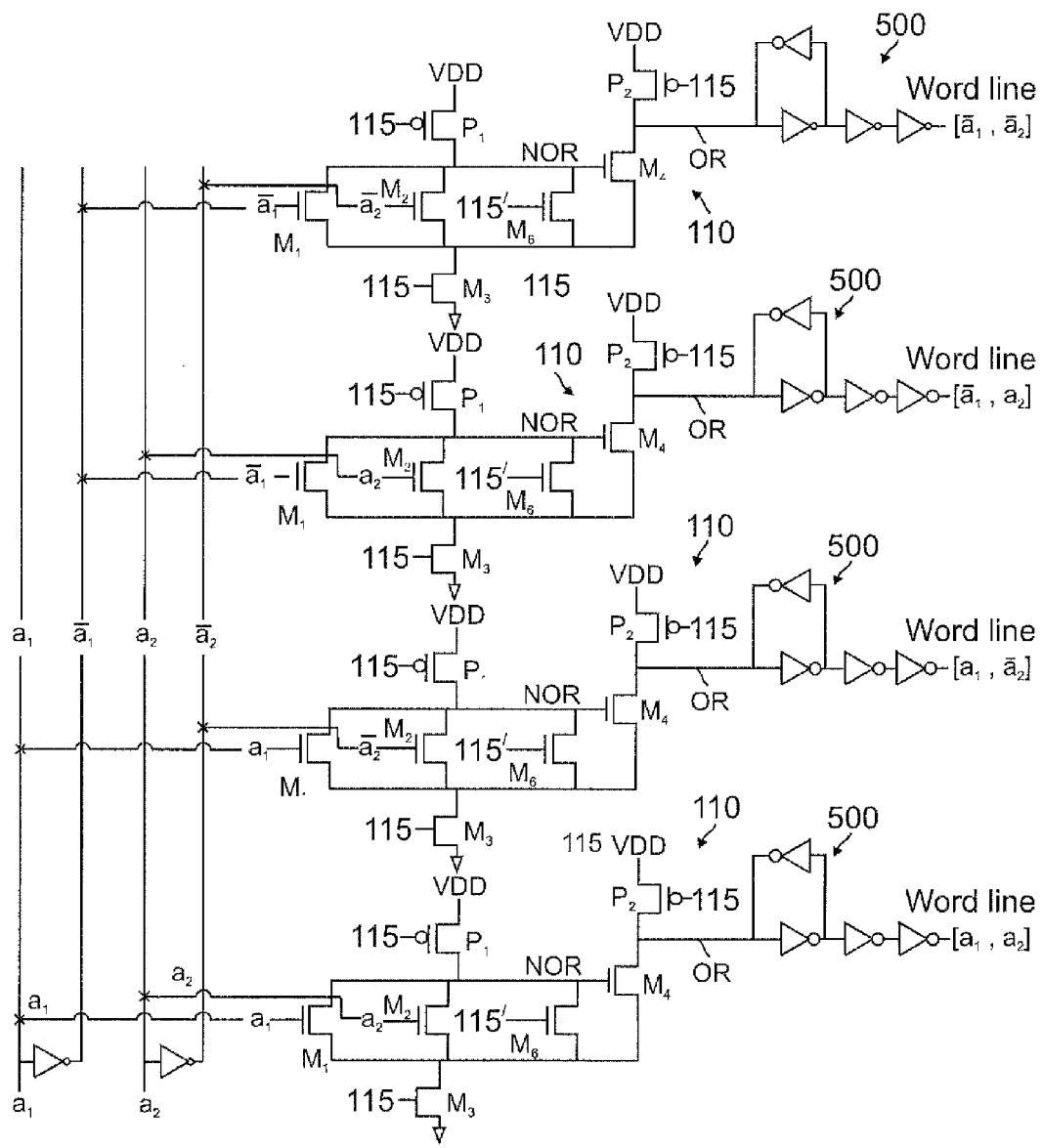
FIG. 5a illustrates an example x-decoder architecture.

Referring back to FIG. 1, upon the assertion of local clock 115, the corresponding x-decoder 110 is triggered to decode its address bits so as to make a decision as to whether a corresponding word line 105 should be asserted. In general, the external world expects the address bits presented to an x-decoder to be latched in that, for example, once external clock 130 has a triggering clock edge (indicating that the current address bits 108 should be decoded), whatever external source that is providing the address bits is then free to change them so as to be prepared for the next triggering clock edge. The latching of the address bits in conventional x-decoders causes delay and power loss. An x-decoder architecture is disclosed herein that advantageously eliminates the need to latch or register address bits. Turning now to FIG. 5a, an example x-decoder 110 is illustrated that uses a dynamic NOR gate/OR gate combination. In this example, there are four word lines selected by two address bits a1 and a2. These two address bits code for a total of four word lines corresponding to addresses [0,0], [0,1], [1,0], and [1,1]. Each word line has a corresponding x-decoder 110. Prior to decoding, each x-decoder charges a dynamic NOR node to VDD through a PMOS transistor P1 driven by local clock 115. Thus, prior to the assertion of local clock 115, each dynamic NOR node is charged to VDD. Upon the assertion of local clock 115, transistors P1 turn off such the charged dynamic NOR nodes then float. As known in the digital arts, a logical NOR operation produces a low output (in a logic high operation) unless all the inputs are low. Thus, the address bits a1 and a2 are also inverted to drive complement address bits $\overline{a1}$ and $\overline{a2}$. The address bits and complement address bits are driven on to corresponding rails so that the appropriate address bits may be distributed to the x-decoders. For the example shown, there are just two address bits a1 and a2 such that there are four possible combinations of true and complement address bits: [a1, a2], [a1, $\overline{a2}$], [$\overline{a1}$, a2], and [$\overline{a1}$, $\overline{a2}$]. Each x-decoder has its dynamic NOR node coupled to NMOS transistors M1 and M2 that have gates driven by the appropriate selection of address bits. For example, the word line selecting for [a1, a2] will only have both address bits low if the externally-provided address is [0,0]. Thus, this word line has its x-decoder's M1 transistor driven by a1 and its M2 transistor driven by a2 from the address rails. Similarly, the x-decoder corresponding to address [1,0] has its M1 transistor driven by $\overline{a1}$ and its M2 transistors driven by a2 from the rails, and so on. Only one x-decoder will thus respond to a given selection of address bits. The x-decoders that are not selected will have at least one input that is driven high. For example, if the externally-provided address is [0,0], address rails $\overline{a1}$ and $\overline{a2}$ are driven high. Each x-decoder's M1 and M2 transistors couple to ground through an NMOS transistor M3 having its gate driven by local clock 115. Accordingly, if local clock 115 is asserted and at least one of the input bits to a given x-decoder is asserted, the corresponding dynamic NOR node will be pulled low. Each dynamic NOR node drives a corresponding NMOS transistor M4 whose source is coupled to the drain of M3 and whose drain is a dynamic OR node that is initially precharged through a PMOS transistor P2 having its gate driven by local clock 115. Thus, as is the case for each dynamic NOR node, each dynamic OR node is pre-charged to a supply voltage VDD while local clock 115 is de-asserted.

Each word line is driven by the complement of the dynamic OR node through an odd number of inverters that provide the appropriate driving strength to assert the corresponding word line. Thus, when a dynamic OR node is driven to ground through the decoding of a presented address by the corresponding dynamic NOR gate, the corresponding word line is driven high so that a memory access may take place. On the other hand, if an x-decoder receives at least one asserted address bit, its dynamic NOR node will be discharged such that the corresponding OR node remains high, thereby keeping the corresponding word line low.

By arranging a cross-coupled inverter with one of the word line inverters, a latch 500 for each x-decoder is efficiently and advantageously formed. Because the appropriate word line is thereby latched high, the NOR node may be released such as through an NMOS transistor M6 arranged in parallel with address bit transistors M1 and M2. The gate of transistor M6 is driven by a delayed version 115' of the local clock. For example, the local clock may be driven through an even number of inverters to provide delayed version 115' having an appropriate amount of delay such that the dynamic NOR node may be pulled low after a word line has been latched high. The word line may then be released upon generation of a sense command signal as will be explained further. Consider the advantages of such an arrangement. By enabling a speedy reset of the word line (through decoupling of the NOR gate by the assertion of delayed clock 115), considerable speed and power savings are achieved because the longer the word line must be maintained high, the more power is dissipated. Moreover, no address bits need be latched, thereby achieving further speed and power saving advantages.

Figure 5B:
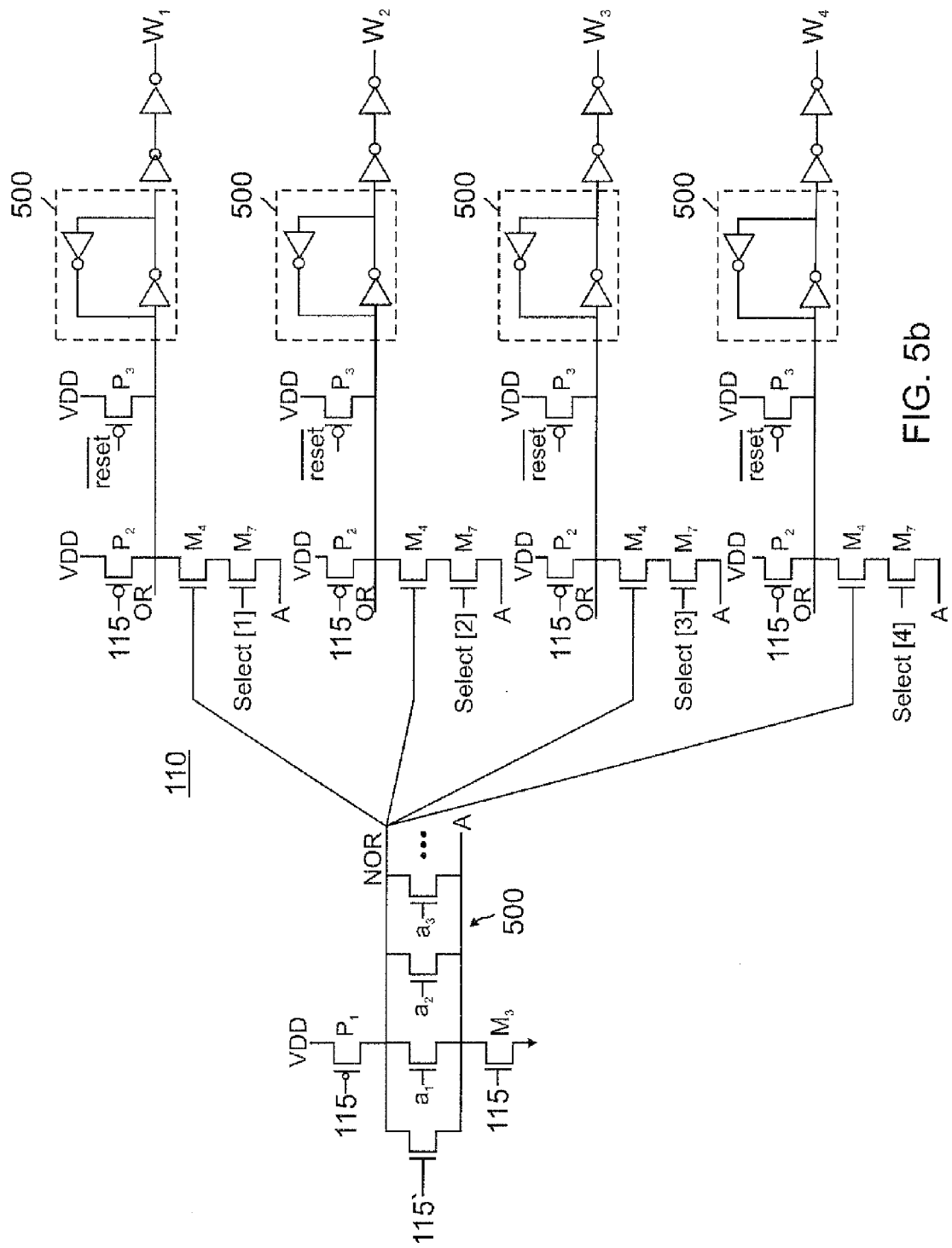
FIG. 5b illustrates another example x-decoder architecture in which the word lines are multiplexed with respect to a given x-decoder.

To minimize loading of the address bits, an x-decoder may be shared among a plurality of word lines. Turning now to FIG. 5b, an x-decoder 110 decodes an address to drive four word lines W1 through W4. The x-decoder 110 operates as discussed with regard to FIG. 5a. However, x-decoder 110 in FIG. 5b decodes an arbitrary number of bits a1, a2, a3, and so on. Each bit is derived from either a true or complement version of externally-supplied local address 106 of FIG. 1. A controller such as global controller 107 in FIG. 1 decodes additional address bits to drive a select signal to select the appropriate word line. For example, if there are four word lines per x-decoder such as in the embodiment shown in FIG. 5b, the global controller would decode two address bits so as to select the appropriate word line. In one embodiment, this selection may occur through an NMOS transistor M7 that is arranged in series with transistor M4 discussed with regard to FIG. 5a. Each transistor M7 receives the corresponding one of a select signal [1] through select signal [4] so as to select the appropriate word line (assuming the NOR node was maintained high after receipt of the address signals). Each OR node is pre-charged while local clock 115 is low such as through operation of a PMOS transistor P2. It may thus be seen that only one OR node will go low upon decoding of an address—the other OR nodes remaining high. After appropriate buffering through an odd plurality of inverters, the low OR node may then assert its word line. As discussed with regard to FIG. 5a, a latch 500 is set by the assertion of the word line. In one embodiment, the latch may be reset through an active low reset signal (asserted upon the assertion of the sense command signal 161 discussed with regard to FIG. 1) that drives the gate of a PMOS transistor P3 to charge the OR node such that the word line is released.

Figure 5C:
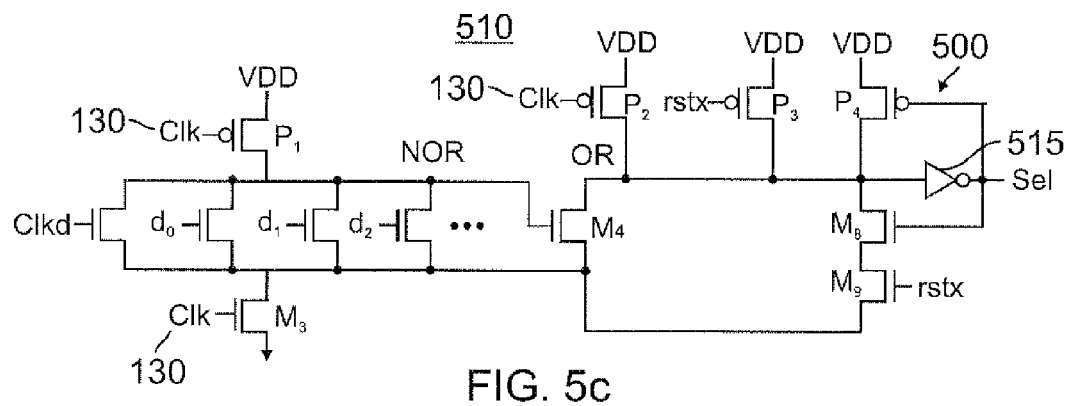
FIG. 5c illustrates an example decoder having an advantageous implementation of the latch.
Figure 5D:
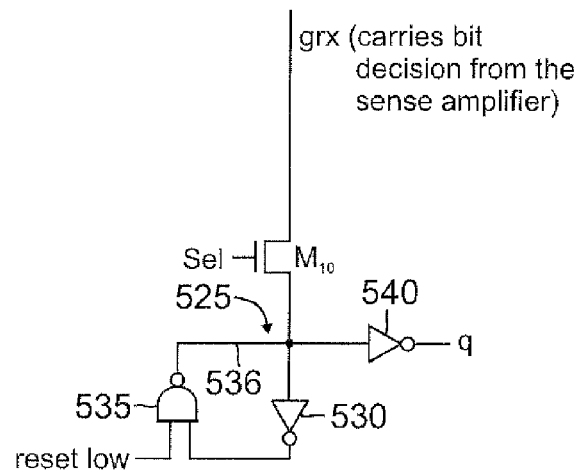
FIG. 5d illustrates a latch for latching a bit decision, the latch being coupled to an output signal line from a sense amplifier through a switch controlled by the decoder of FIG. 5c.

The resulting dynamic NOR/OR decoder and latch combination has applications in areas besides an x-decoder. For example, a memory requires some sort of latch to register output bits being provided by the sense amplifiers. In other words, once a sense amplifier drives a bit decision into an output line, that output line must be reset before the next write cycle (such as triggered by the next rising edge in external clock 130). Turning now to FIG. 5c, a decoder 510 includes a dynamic NOR node precharged as discussed with regard to FIGS. 5a and 5b. However, in this embodiment, decoder 510 is responsive to external clock 130. For example, a decoder in global controller 107 of FIG. 1 may be used to control the output read lines (not illustrated) from the sense amplifiers. These read lines are then ported externally from the memory so that the external world may read the contents of accessed memory cells. Thus, decoder 510 need not decode address bits per se such that signals d0, d1, and d2 that drive the gates of the transistors coupling the NOR node to the drain of transistor M3 may be representative of read enable signals and other control signals used during a read operation. The NOR node is reset through a delayed version (clkd) of the external clock analogously as discussed with regard to FIGS. 5a and 5b. Latch 500 is formed through the cross-coupled inverters formed by inverter and the cross-coupled inverter formed by a PMOS transistor P4 and an NMOS transistor M8. The latch may be reset by an active low reset signal rstx as discussed with regard to FIG. 5b. However, note that by coupling the source of M8 to an NMOS transistor M9 whose gate is driven by rstx and whose source couples to the drain of M3, the latch may be reset without fighting transistor M8. In other words, if the source of M8 directly coupled to ground, it would oppose the reset of the latch by P3. However, by isolating the source of M8 from ground through transistor M9 (which is turned off when rstx is asserted), such a fight is avoided. The resulting decoder drives a signal sel that is divorced from the external clock duty cycle. As will be discussed further herein, this signal may be used to enable a read from the read output lines coming from the sense amplifiers to the external world. Referring back to FIG. 2, such an independent global decoder enables the multiplexing of the various blocks because the read operation from any particular block need not be completed within a 50% duty cycle of the external clock. Turning now to FIG. 5d, a line grx represents the output signal from a sense amplifier. As discussed above, an output from this line should be latched so that the grx line may be reset from a subsequent read operation. A latch 525 may be formed using an inverter 530 and a NAND gate 535 that receives an output from the inverter and from a reset low signal. This reset low signal is derived from the external clock signal and is driven low such that the latch is reset to pull a node 536 driven by an output of NAND gate 535 high before the select signal sel (discussed with regard to FIG. 5c) is asserted. It may thus be seen that the grx line (carrying the result from the sense amplifier) need only pull node 536 low (should grx carry a zero) in that the default state of this node is high. Thus, unlike the prior art, grx line 535 may couple through a single NMOS transistor M10 to node 536 rather than through a transmission gate. In this fashion, density is enhanced. Referring back to FIG. 5c, if decoder 510 asserts select signal sel, then transistor M10 in FIG. 5d will conduct to couple grx to the outside world through an inverter 540 to drive an output signal q.

Figure 6:
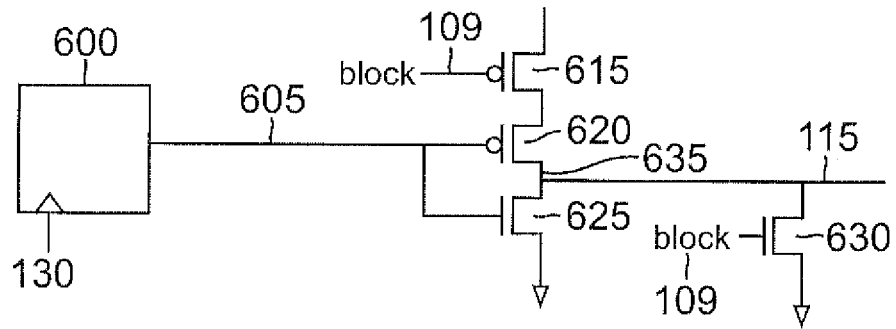
FIG. 6 illustrates a local clock source.
Figure 7:
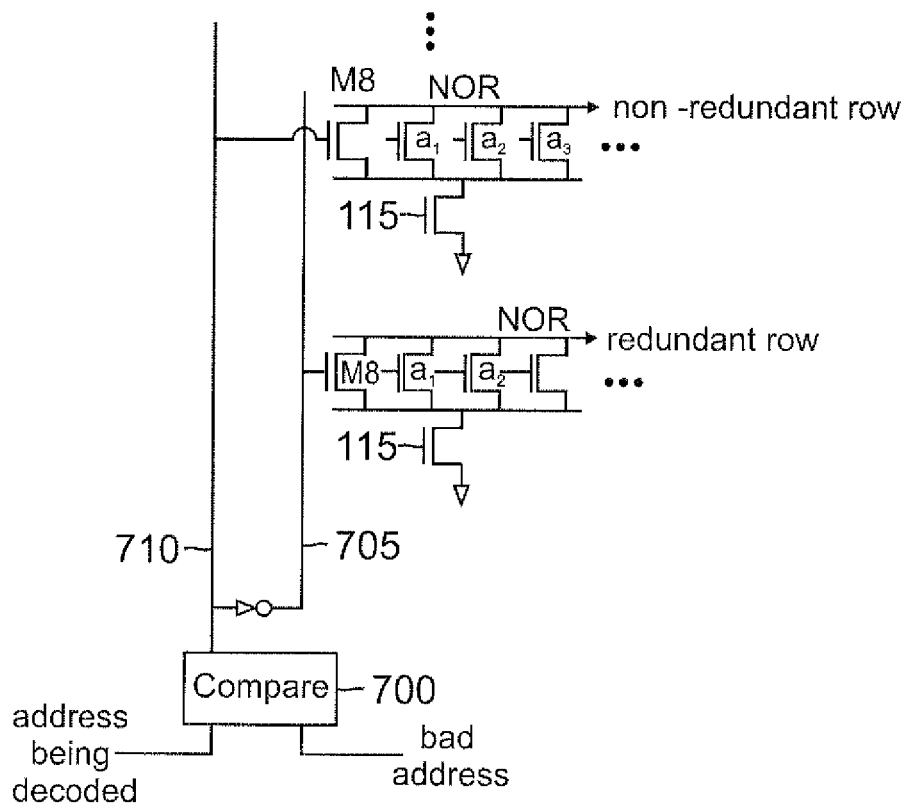
FIG. 7 illustrates a redundancy scheme for an x-decoder architecture.

A decoder should not decode until its input signals have settled. For example, referring back to FIG. 5b, it will be appreciated that local clock 115 should not be asserted until the true and complement address bits on the rails shown in FIG. 5a have settled to their appropriate values. To provide greater efficiency, each x-decoder may have its own local clock source. Moreover, this local clock need not be generated in an SR latch such as discussed with regard to FIG. 1. Thus, turning now to FIG. 6, a row address replica circuit 600 may be provided that replicates the behavior of the address rails discussed with regard to FIG. 5a. Row address replica circuit 600 is triggered by the external clock 130 and models the driving circuit that drives the address bits onto the address rails by asserting an active-low row address replica signal 605. Thus, active-low address replica signal 605 is asserted at the same time the address rails are asserted. Global controller 107 (FIG. 1) decodes address 108 so as to drive an active-low block signal 109 that designates which block (such as block 101 or 102) is being selected for. Thus, upon the assertion of signals 605 and 109, corresponding PMOS transistors 615 and 620 will conduct so that local clock 115 is asserted. Both row address replica signal 605 and block signal 109 may de-assert local clock 115 because these signals drive the gates of NMOS transistors 625 and 630, respectively. Thus, local clock 115 will not be asserted until the address bits have settled on the address rails. It may be seen that block signal 109 prevents clock sources in unselected blocks from being wastefully asserted. Through operation of PMOS transistors 615 and 620 as well as NMOS transistors 625 and 630, a node 635 that carries local clock 115 represents the logical NOR of the block and row address replica signals. Local clock 115 is driven by this NOR node such that the local clock will be asserted only after the address presented to the x-decoder has settled and the block signal has been asserted (in its active low state). The global controller may then reset the block signal responsive to the assertion of the sense command so that the local clock may be de-asserted. Should clock source 120 comprise an SR latch having a NAND gate, it may be appreciated that the NOR behavior discussed with regard to FIG. 6 may be merged with the SR latch's NAND gate so that generation of local clock 115 by the latch will have the appropriate timing with regard to the settling of the address bits.

The dynamic NOR/OR x-decoder architecture discussed with regard to FIGS. 5a, 5b, and 5c may advantageously be modified to accommodate a redundant word line row. In this fashion, should a memory be manufactured with a defective row, the address corresponding to the defective row may be switched to a redundant x-decoder and word line combination. The non-redundant row's and the redundant row's x-decoders are constructed analogously as discussed with regard to FIG. 5a. However, each x-decoder in the non-redundant row has its dynamic NOR node modified so as to include an extra transistor M8 arranged in parallel with the transistors receiving the address signals derived from the address rails discussed with regard to FIG. 5a. These address rails may be arranged in parallel with a match rail 710 and a mismatch rail 705. Each transistor M8 in the non-redundant rows has its gate driven by match rail 710. The redundant row's x-decoder has its NOR node also coupling to transistor M8. In contrast to the non-redundant rows, transistor M8 in the redundant row has its gate driven by mismatch rail 705. The additional address transistors arranged in parallel with M8 in the redundant row may have their gates shorted to rail 705 as well instead of receiving address bits from the address rails.

During manufacture, the various non-redundant word lines are tested to see if a particular row address is bad. The bad address may be burned into a non-volatile memory (not illustrated). A comparator 700 compares the stored bad address to the row address being decoded and asserts match rail 710 if the comparison indicates a match. Rail 705 is driven as the complement of rail 710. Thus, unless the row address being decoded matches the bad address previously detected, rail 710 remains low. It may thus be seen that the operation of the non-redundant decoders is unaffected in such a circumstance. In contrast, rail 705 remains high unless there is a match such that the redundant x-decoder will not fire if the row address being decoded does not match the bad address because rail 705 is asserted such that the NOR node is discharged in the redundant x-decoder. However, if there is a match to the bad address, all the non-redundant x-decoder's will have their NOR node pulled low because transistors M8 in these decoders will conduct. Thus, all the non-redundant x-decoders will not fire if the comparator 700 indicates a match. Conversely, the redundant x-decoder will fire if there is a match to the bad address because transistor M8 and the remaining transistors in parallel with it will not conduct such that the redundant x-decoder's NOR node will stay high. In this fashion, through the addition of just a single transistor in each non-redundant x-decoder, redundancy is enabled. Such an advantageous accommodation of redundancy is yet another advantage of the dynamic NOR/OR x-decoder architecture disclosed herein.

The above-described embodiments of the present invention are merely meant to be illustrative and not limiting. It will thus be obvious to those skilled in the art that various changes and modifications may be made without departing from this invention in its broader aspects. Therefore, the appended claims encompass all such changes and modifications as fall within the true spirit and scope of this invention.

What is claimed is:

1. A decoder for decoding an address having a plurality of bits ranging from a first address bit $a_1$ to a last address bit $a_N$, each address bit being either true or false, comprising:
   a pre-charge circuit configured to pre-charge a dynamic NOR node and a dynamic OR node and then allow the pre-charged dynamic NOR node and pre-charged dynamic OR node to float, wherein the pre-charge circuit allows the pre-charged dynamic NOR node and the pre-charged dynamic OR node to float upon assertion of a clock signal;
   a plurality of switches coupled between the dynamic NOR node and ground, each switch corresponding uniquely to the address bits such that the switches range from a first switch corresponding to $a_1$ to an nth switch corresponding to $a_N$, wherein each switch is configured to turn on only if its corresponding address bit is false;
   a (n+1)th switch coupling the dynamic NOR node to the ground;
   a (n+2)th switch coupled between the dynamic NOR node and the ground and arranged in parallel with the plurality of switches, the (n+2)th switch being driven by a delayed version of the clock signal;
   an odd plurality of three or more word line inverters coupled in series with the dynamic OR node, one of the three or more word line inverters being further arranged with a cross-coupled inverter; and
   a word line driven by the odd plurality of inverters.

2. The decoder of claim 1, wherein the cross-coupled inverter is formed from both a PMOS transistor and an NMOS transistor.

3. The decoder of claim 1, wherein the delayed version of the clock signal causes the dynamic NOR node to be pulled low after the word line has been latched high via a latch formed with the cross-coupled inverter.

4. The decoder of claim 1, wherein the (n+1)th switch and the (n+2)th switch are NMOS transistors.

5. The decoder of claim 1, wherein a first of the three or more word line inverters in the series is arranged with the cross-coupled inverter.

6. A decoder for decoding an address having a plurality of bits ranging from a first address bit $a_1$ to a last address bit $a_N$, each address bit being either true or false, comprising:
   a pre-charge circuit configured to pre-charge a dynamic NOR node and a dynamic OR node and then allow the pre-charged dynamic NOR node and pre-charged dynamic OR node to float, wherein the pre-charge circuit allows the pre-charged dynamic NOR node and the pre-charged dynamic OR node to float upon assertion of a clock signal;

a plurality of switches coupled between the dynamic NOR node and ground, each switch corresponding uniquely to the address bits such that the switches range from a first switch corresponding to $a_1$ to an nth switch corresponding to $a_N$, wherein each switch is configured to turn on only if its corresponding address bit is false;

a (n+1)th switch coupling the dynamic NOR node to the ground;

a (n+2)th switch coupled between the dynamic NOR node and the ground and arranged in parallel with the plurality of switches, the (n+2)th switch being driven by a delayed version of the clock signal;

an odd plurality of inverters coupled in series with the dynamic OR node; and a word line driven by the odd plurality of inverters.

7. The decoder of claim 6, wherein one of the odd plurality of inverters is further coupled with a cross-coupled inverter and thereby forms a latch, and wherein the delayed version of the clock signal causes the dynamic NOR node to be pulled low after the word line has been latched high via the latch.

8. The decoder of claim 6, wherein the (n+1)th switch and the (n+2)th switch are NMOS transistors.

9. The decoder of claim 6, wherein the odd plurality of inverters comprises three or more word line inverters coupled in series with the dynamic OR node, one of the three or more word line inverters being further arranged with a cross-coupled inverter.

10. The decoder of claim 9, wherein a first of the three or more word line inverters in the series is arranged with the cross-coupled inverter.

* * * * *